United States Patent
Sickmiller

(10) Patent No.: US 6,214,733 B1
(45) Date of Patent: Apr. 10, 2001

(54) PROCESS FOR LIFT OFF AND HANDLING OF THIN FILM MATERIALS

(75) Inventor: Mike E. Sickmiller, Los Angeles, CA (US)

(73) Assignee: ELO Technologies, Inc., Torrance, CA (US)

( * ) Notice: Subject to any disclaimer, the term of this patent is extended or adjusted under 35 U.S.C. 154(b) by 0 days.

(21) Appl. No.: 09/442,030

(22) Filed: Nov. 17, 1999

(51) Int. Cl.[7] ................................................. H01L 21/302

(52) U.S. Cl. ..................... 438/691; 438/458; 438/479; 438/977; 438/915

(58) Field of Search .................................. 438/458, 459, 438/479, 492, 977, 691; 117/915

(56) References Cited

U.S. PATENT DOCUMENTS

| | | |
|---|---|---|
| 4,667,212 | 5/1987 | Nakamura . |
| 4,846,931 | 7/1989 | Gmitter et al. . |
| 4,883,561 | 11/1989 | Gmitter et al. . |
| 5,073,230 | 12/1991 | Maracas et al. . |
| 5,244,818 * | 9/1993 | Jokerst et al. ............................ 437/3 |
| 5,280,184 | 1/1994 | Jokerst et al. . |
| 5,286,335 | 2/1994 | Drabik et al. . |
| 5,344,517 * | 9/1994 | Houlding ............................... 156/236 |
| 5,391,257 * | 2/1995 | Sullivan et al. ....................... 156/630 |
| 5,391,267 | 2/1995 | Sullivan et al. . |
| 5,401,983 | 3/1995 | Jokerst et al. . |
| 5,465,009 | 11/1995 | Drabik et al. . |
| 5,578,162 | 11/1996 | D'Asaro et al. . |
| 5,627,112 * | 5/1997 | Tennant et al. ....................... 438/113 |
| 5,827,751 | 10/1998 | Nuyen . |
| 5,985,687 * | 11/1999 | Bowers et al. .......................... 438/46 |
| 6,013,534 * | 1/2000 | Mountain ................................. 438/15 |
| 6,027,988 * | 2/2000 | Cheung et al. ....................... 438/513 |
| 6,033,995 * | 3/2000 | Muller .................................. 438/749 |

OTHER PUBLICATIONS

J. J. Callahan et al. "Alignable Liftoff Transfer of Device Arrays Via a Single Polymeric Carrier Membrane" Electronic Letters, vol. 29, No. 11, pp. 951–953, May 1993.*

E. Yablonovitch et al. "Van der Waals bonding of GaAs on Pd leads to a permanent, solid–phase–topotaxial, metallurgical bond" Applied Physics Letters, vol. 59, No. 24, pp. 3159–3161, Dec. 1991.*

(List continued on next page.)

Primary Examiner—Matthew Smith
Assistant Examiner—Renzo N. Rocchegiani
(74) Attorney, Agent, or Firm—Michael Zarrabian

(57) ABSTRACT

A process for lift-off of at least one thin film layer situated on a substrate is disclosed, including the steps of: depositing a support layer such as polymer on the thin film layer, wherein the support layer maintains the structural integrity of the thin film layer; attaching a rigid carrier superstrate to the support layer; and removing at least a portion of the substrate, wherein the thin film layer remains attached to the carrier superstrate via the support layer. After removing the substrate, the thin film layer is attached to a host substrate, and the carrier superstrate is removed from the thin film layer to leave the thin film layer attached to the host substrate. Removing the carrier superstrate from the thin film layer can include mechanically detaching the carrier superstrate from the thin film layer, such that only selected segments of the thin film layer remain attached to the host substrate. Attaching the thin film layer to the host substrate can include selectively attaching segments of the thin film layer to the host substrate, such that when the carrier superstrate is removed, the selected segments of the thin film layer remain attached to the host substrate. The selective attachment can be by selectively depositing bonding material on segments of the host substrate, and aligning the thin film layer with the host substrate such that the selected segments of the thin film material are aligned with said segments of the host substrate, respectively.

27 Claims, 5 Drawing Sheets

OTHER PUBLICATIONS

C. Camperi–Binestet et al. "Alignable Epitaxial Liftoff of GaAs Materials with Selective Deposition Using Polymide Diaphragms" IEEE Transactions Photonics Technology Letters, vol. 3, No. 12, pp. 1123–1126, Dec. 1991.*

Proceedings 1994 IEEE International SOI Conference, Oct. 1994 Silicon on Aluminum Nitride Structures Formed by Wafer Bonding S.Bengtsoon+, M. Choumas+, W.P. Maszara&, M. Bergh+, C. Olesen+, U. Sodervall* and A. Litwin# +)Department of Solid State Electronics, *)Department of Physics, SIMSlab Chalmers University of Technology, S–412 96 Goteborg, Sweden &) AlliedSignal, Columbia, MD 21045, USA #)MERC, Ericsson Components, S–164 81 Kista, Sweden.

Time–Resolved Photoluminescence Studies on Transferred Thin Film InP Epllayers G. Augustine, B.m. Keyes*, N.M. Jokerst, A. Rohatgi, R.K. Ahrenkiel* Microelectronics Research Center School of Electrical Engineering Georgia Institute of Technology Atlanta, Georgia 30332–0250 National Renewable Energy Laboratory Golden, CO 80401, USA.

A Fine–Grain, High–Throughput Architecture Using Through–Wafer Optical Interconnect W. Stephen Lacy, Christopher Camperi–Ginestet, Brent Buchanan D. Scott Wills, Nan Marie Jokerst and Martin Brooke School of Electrical and Computer Engineering Georgia Institute of Technology Atlanta, Georgia 30332–0250 0–8186–5830–4/94 $3.00 1994 IEEE.

IEEE Photonics Technology Letters, vol. 6 No. 9, Sep. 1994 Integration of Thin Film Optoelectronic Devices Onto Mictomachined Movable Platforms Scott T. Wilkinson, Young W. Kim, Nan M. Jokerst, and Mark G. Allen 1041–1135/94$04.00 1994 IEEE.

Epitaxial lift–off in photovoltaics: ultra thin Alo.2 Gao.8As Cell in a mechanically stacked (Al,Ga) As/Si tandem: K. Zahraman, J.C. Guillaum, G. Nataf B. Beaumont, M. Leroux, P. Gibart and J.P. Faurie Centre de Recherche Sur l'Hetero–Epitaxie et ses Applications Center National de la Recherche Scientifique Sophia Antipolis, Rue Bernard Gregory, 06560 Valbonne, France CH3365–4/94/0000–1898 $4.00 1994 IEEE First WCPEC; Dec. 5–9, 1994; Hawaii.

Re–Use of Gass Substrates for Epitaxial Lift–Off III–V Solar Cells P.R. Hageman, A. Geelen, R.A.J. Thomeer and L.J. Gilling Department of Experimental Solid State Phsics, University of Nijmegen, Toernooiveld 1, 6525 ED Nijmegen, the Netherlands CH3365–4/94/0000–1910 $4.00 1994 IEEE First WCPEC; Dec. 5–9, 1994; Hawaii.

1997 Electronic Components and Technology Conference. Design Issues for Through–Wafer Optoelectronic Multicomputer Interconnects P.May, S.T. Wilkinson, N. M. Jokerst, D. S. Wills, M. Lee, O. Vendier, S. W. Bond Z. Hou, G. Dagnall, M. A. Brokke, A. Brown Scholl of Electrical and Computer Engineering Microelectronics Research Center Georgia Institute of Technology Atlanta, Georgia 30332–0250 0–8186–7/95 $4.00 1995 IEEE.

CMOS Optical Receiver with Integrated Compound Semiconductor Thin–Film Inverted MSM Detector Operating at 155 Mbps Myunghee Lee, Olivier Vendier, Marting A. Brooke, Nan Marie Jokerst, and Richanrd P. Leavitt* Georgia Institute of Technology Atlanta, GA 30332.

High Responsivity, High Speed InP–Based Inverted MSM Photodetectors Olivier Vendier, Nan Marie Jokerst, and Richard P. Leavitt* Georgia Institute of Technology Atlanta, GA 30332–0250 Army Research Laboratories.

Journal of Lightwave Technology, vol. 13, No. 6, Jun. 1995 A Three–Dimensional High–Throughput Architecture Using Through–Wafer Optical Interconnect 0733–8724/95$0.4.00 1995 IEEE.

IEEE Photonics Technology Letters, vol. 5, No. 2, Feb. 1993 Vertical Optical Communication Throgh Stacked Silicon Wafers Using Hybrid Monolithic Thin Film InGaAsP Emitters and Detectors K.H. Calhoun, C.B. Camperi–Ginestet, and N. M. Jokerst 1041–1135/93$o3.00 1993 IEEE.

Electronics Letters 3rd Aug. 1995 vol. 31 No. 16 Epitaxial lifoff inGaAs/Inp MSM photodetectors on Si.

Integrating Optical Receiver Transplanted by Epitaxial Lift Off T. Morf, C. Brys*, P. De Dobbelaere*, P. Van Daele*, P. Demeester*, T. Martinson**, W. Bachtold Swiss Federal Institute of Technology, Laboratory for EM Fields and Microwave Electronics, Gloriastr. 35, CH 8092 Zurich, Switzerland Tel+41 1 632 66 81;Fax +41 1 632 11 98 * Univeristy of Gent–IMEC, Department of Information Technology, Gent, Belgium ** Ascom Tech, Bern, Switzerland 0–7803–2966–x/95 $4.00 1995 IEEE.

Optical MCM Interconnect Using Hybrid Integration of GaAs Optolectronics with a Glass Signal Routing Layer 0569–5503/95/0000–0770 $3.00 1995 IEEE.

Dark current in pin photodetectors fabricated by preprocessing and postprocessing techniques of epitaxial liftoff Electronics Letters 3rd Aug. 1995 vol. 31, No. 16.

Alignable Lift–Off Transfer of Device Arrays via a Single Polymeric Carrier Membrane john J. Callahan, Rainer Dohle, Kevin P. Martin, Timothy J. Drabik School of Electrical and Computer Engineering and Microelectronics Research Center Georgia Institute of Technology Atlanta, GA, 30332 0569–5503/95/0000–1274 $3.00 1995 IEEE.

Mololithic Integration of a 94GHz AlGaAs/GaAs 2DEG Mixer on Quartz Substrate by Epitaxial Lift–Off Richardo Basco, Ajay Prabhu, sigfrid Yngvesson, and Kei May Lau Department of Electrical and Computer Engineering University of Massachusetts, Amherst MA 01003, (413) 545–0923.

Electronics Letters 1st Sep. 1994 vol. 30 No. 18 InP/InGaAs resonant cavity enhanced photodetector and light emitting diode with external mirrors on Si.

IEEE Journal of Quantum Electronics, vol. 30, No. 8, Aug. 1994 RF Control of Epitaxial Lift–Off PHEMT's Under Backside Illunimation Paul G. Young Rainee N. Simons, IEEE Senior Member, Samuel A. Alterovitz, Robert R. Romanofsky, and Edwyn D. Smith 0018–9197/94$04.00 1994 IEEE.

1.52–1.59 u.m Range Different–Wavelength Modulator–Integrated DFB–LDs Fabricated on a Single Wafer K. Kudo, M. Ishizaka, T. Sasaki, H. Yamazaki, and M. Yamaguchi Optoelectronics and High–Fraquency Device Research Laboratories NEC Corporation 34 Miyukigaoka, Tsukuba, Ibaraki 305, Japan Phone: +81–298–50–2636, Fax: +81–298–50–1106 e–mail: kudo@optd.cl.nec.co.jp ECOC 97, Sep. 22–25, 1997, Conference Publication No. 448, IEE 1997.

IEEE Transactions on Electron Devices, vol. 43, No. 9, Sep. 1996 RF and 1/F Noise Investigations on MESFETS and Circuits Transplanted by Epitaxial Lift Off Thomas Morf, Student Member, IEEE, Catherine Brys, Peter Van Daele, Member IEEE Piet Demeester, Member, IEEE, Hansruedi Benedickter, and Werner Bachtold, Member IEEE 0018–9383/96$05.00 1996 IEEE.

IEEE Transactions on Components, Packaging, and Manufacturing Technology—Part B, vol. 19, No. 1, Feb. 1996 A New Bonding Technique for Microwave Devices G. Rainer Dohle, John J. Callahan, Kevin P. Martin, and Timothy J. Drabik 1070–9894/96405.00 1996 IEEE.

Proceedings 1996 IEEE International SOI Conference, Oct. 1996 Feasibility Study of VLSI Device Layer Transfer by CMP PETEOS Direct Bonding 0–7803–3315–2 96CH35937.

IEEE Transactions on Electron Devices, vol. 42, No. 11, Nov. 1995 Epitaxial Lift–Off GaAs HEMT's Divyang M. Shah Member, IEEE Winston K. Chan, Member IEEE, Catherine Caneau, Thomas J. Gmitter, Jong–In Song, Brian P. Hong, Paul F. Micelli, and Frank De Rosa 0018–9383/95$04.00 1995 IEEE.

IEEE Electron Device Letters, vol. 16, No. 9, Sep. 1995 AlGaAs/GaAs Heterojunction Bipolar Transistors on Si Substrate Using Epitaxial Lift–Off J.C. Fan, C. P. Lee, Member, IEEE, J. A. Hwang, and J. H. Hwang 0741–3106/95$04.00 1995 IEEE.

Epitaxial lift–off in photovoltaics: ultra thin Alo.2Gao.8As cell in a mechanically stacked (Al,Ga)As/Si tandem: K. Zahraman, J.C. Guillaume, G. Nataf B. Beaumont, M. Leroux, P. Gibart and J.P. Faurie Centre de Recherche sur l'hetero–Epitaxie et ses Applications, Centre National de la Recherche Scientifique Sophia Antipolis, Rue Bernard Gregory, 06560 Valbonne, France CH3365–4/94/0000–1898 $4.00 1994 IEEE First WCPEC; Dec. 5–9, 1994; Hawaii.

Integrated 1.55u.m Receivers Using GaAs MMICS and Thin Film InP Detectors Carl Chun, Olivier Vendier, Emily Moon, Joy Laskar, Hyeon Cheol Ki, Nan Marie Jokerst, Martin Brooke School of Electrical and Computer Engineering Packaging Research Center Georgia Institute of Technology Atlanta, GA 30332–0269 0–7803–4471–5/98/$10.00 1998 IEEE 1998 IEEE MTT–S Digest.

Fabrication of Surface Acoustic Wave Semiconductor Coupled Devices Using Epitaxial Lift–off Technology K.Hohkawa, H.Suzuki*, Q.S. Huang, and S. Noge Kanagawa Inst. Tech. Aatugi, Kanagawa, 243–01 Japan *)Meidensha Co. Ohsaki, Shinagawa, Tokyo, 141 Japan 0–7803–2940–6/95/$4.00 1995 IEEE 1995 IEEE Ultrasonics Symposium –401.

IEEE Photonics Technology Letters, vol. 7, No. 10, Oct. 1995 Optical Mixing in Eptiaxial Lift–Off Pseudomorphic HEMT's D.Bhattacharya, Student Member, IEEE, P.S. Bal, H. R. Fettermann, Fellow, IEEE, and D. Streit, Senior Member, IEEE 1041–1135/95$04.00 1995 IEEE.

Terabit Switching and Security Enhancement in a WDM/TDM Hybrid System Cedric F. Lam and Eli Yablonovitch UCLA Electrical Engineering Department 405 Hilgard Ave., Los Angeles, CA 90095–1594.

Proceedings 1994 IEEE International SOI Conference, Oct. 1994 Silicon on Aluminum Nitride Structures Formed by Wafer Bonding S.Bengtsson+, M. Choumas+, W. P. Maszara&, M. Bergh+, C. Olesen+, U. Sodervall* and A. Litwin# +)Department of Solid State Electronics, *)Department of Physics, SIMSLab Chalmers University of Technology, S–412 96 Goteborg, Sweden &) AlliedSignal, Columbia, MD 21045, USA #)MERC, Ericsson Components, S–164 81 Kista, Sweden 94CH35722.

IEEE Transactions on Components, Packaging, and Manufacturing Technology—Part B, vol. 19, No. 1. Feb. 1996 Thin–Film Multimaterial Optoelectronic Integrated Circuits Nan Marie Jokerst, Member, IEEE, Martin, A. Brooke, Olivier Vendier, Scoot Wilkinson, Suzanne Fike, Myunghee Lee, Elizabeth Twyford, Jeffrey Cross, Brent Bunchanan, and Scoot Wills, Member LEEE 1070–9894/96$05.00 1996 IEEE.

IEEE Transactions on Electron Devices, vol. 43, No. 11, Nov. 1996 Substrate Free GaAs Photovoltaic Cells on Pd–Coated Silicon with a 20% AMI 1.5 Efficiency Franck Omnes, Jean–Claude Guillaume. Gilles Nataf, Gerold Jager–Waldau. Philippe Vennegues, and Pierre Gibart 0018–9383/96$05.00 1996 IEEE.

Quasi–monolithic GaAs/Lib\Nbo3–hybrids for acoustoelectric applications Markus Rotter, Achim Wixforth, and Jorg P. Kotthaus, Skektion Physik der LMU, Geschwister–Scholl–Platz. 1,D–80539 Munchen, Germany Werner Ruile, Daniela Bernkau, and Henning Riechert, Siemens AG, Corporate Technology, D–81730 Munchen, Germany 0–7803–4153–8/97/$10.00 1997 IEEE 1997 IEEE Ultrasonics Symposium–201.

1998 international Symposium on Advavced Packaging Materials Review of RF Packaging Research at Georgia Tech's PRC J. Laskar, N. Jokerst, M. Brooke, M. Harris, C. Chun, A. Pham, H. Liang, D. Staiculescu and S. Sutono Packaging Research Center Georgia Institute of Technology.

IEEE Photonics Technology Letters, vol. 8, No. 10 Oct. 1996 A Single–Fiber Bidirectional Optical Link Using Colocated Emitters and Detectors Jeffrey Croos, Abelardo Lopez–Lagunas, Member IEEE, Brent Buchanan, Lawrence Carastro, Member, IEEE Shin–Cheng Wang, Nan Marie Jokerst, Member, IEEE, Scott Wills, Member, IEEE Martin Brooke, Member IEEE, and Mary Ann Ingram, Member IEEE 1041–1135/96$0.5.00 1996 IEEE.

IEEE Electron Device Letters, vol. 17, No. 9, Sep. 1996 Thin Film Pseudomorphic AlAs/In0/53Ga0.47 As/InAs Resonant Tunneling Diodes Integrated onto Si Substrates N. Evers, O. Vendier, C. Chun, M. R. Murti, J. Laskar, Member IEEE, N. M. Jokerst, Member, IEEE T. S. Moise, Member, IEEE and Y.–C. Kao, Member IEEE 0741–3106/96$05.00 1996 IEEE.

IEEE Photonics Technology Letters, vol. 8, No. 2, Feb. 1996 Thin–Film Inverted MSM Phtodetectors Olivier Vendier, Student Member, IEEE, Nan Marie Jokerst, Member IEEE and Richard P. Leavitt, Member, IEEE 1041–1135/96$05.00 1996 IEEE.

A 155 Mbps Digital Transmitter Using GaAs Thin Film LEDs Bonded to Silicon Driver Circuits Olivier Vendier, Scott T. Wilkinson, Steven W. Bond, Myunghee Lee, Zhuange Hou, Abelardo Lopez–Lagunas, Phil May. Martin Brooke, Nan Marie Jokerst, Scott Wills and Richard P. Leavitt Georgia Institute Of Technology College of Electrical Engineering Atlanta, Ga 30332–0269.

CMOS Optical Receiver with Integrated In GaAs Thin–Film Inverted MSM Detector Operating up to 250 Mbps Myunghee Lee, Olivier Vendier, Martin A. Brooke, Nan Marie Jokerst, and Richrd P. Leavitt* School of Electircal and Computer Engineering Microelectronics Research Center Georgia Institute of Technology Atlanta, GA 30332 * Army Research Laboratories AMSRL–EP–EE 2800 Powder Mill Road Adelphi–MD 20783–1197.

A Smart Pixel Bi–Directional Optical Link Using Co–Located Emitters and Detectors Jeffrey Cross, Abelardo Lopez–Lagunas, Brent Buchanan, Lawrence Carastro, Shih–Cheng Wang, Nan Marie Jokerst, Scott Wills, Martin Brooke, and Mary Ann Ingram School of Electrical and Computer Engineering Microelectronics Research Center Georgia Institute of Technology Atlanta, GA 30332–0250 Tel. (404) 894–9917 Fax. (404) 894–0222 Email: jcross@azalea.mirc.gatech.edu.

IEEE Photonics Technology Letters, vol. 7, No. 10, Oct. 1995 8x8 Array of Thin–Film Photodetectors Vertically Electrically Interconnected to Silicon Circuitry S. M. Fike, B. Buchanan, N. M. Jokerst, Member, IEEE, M. A. Brooke, T. G. Morris, and S. P. DeWeerth 1041–1135/95$0.4.00 1995 IEEE.

IEEE Photonics Technology Letters, vol. 7, No. 9, Sep. 1995 Communication Through Stacked Silicon Circuitry Using Integrated Thin Film InP–Based Emitters and Detectors N. M. Jokerst, Member, IEEE, C. Camperi–Ginestet, B. Buchanan, S. Wilkinson, and M. A. Brooke, Member, IEEE 1041–1135/95$0.4.00 1995 IEEE.

IEEE Photonics Technology Letters, vol. 7, No. 7, Jul. 1995 A Pixellated Grating Array Using Photoelectrochemical Etching on a GaAs Waveguide Elizabeth J. Twyford, Student Member, IEEE Nan Marie Jokerst, Member, IEEE Paul A. Kohl, and Tristan J. Tayag, Member, IEEE 1041–1135/95$04.00 1995 IEEE.

Silicon VLSI Processing Architectures Incorporating Integrated Optoelctronic Devices Huy H. Cat, Myunghee Lee, Brent Buchanana, D. Scott Wills, Martin Brooke, and Nan Marie Jokerst School of Electrical and Computer Engineering Atlanta, Georgia 30332–0250 0–8186–7047–9/95 $04.00 1995 IEEE.

Determination of Franz–Keldysh Electrorefraction Near the GaAs Absorption Edge Using Epitaxial Liftoff Thin Film Semiconductor Etalons Kenneth H. Calhoun, N. M. Jokerst Microelectronics Research Center School of Electrical Engineering Georgia Institute of Technology Atlanta, GA 30332–0250.

1:30pm–1:45pm OPM 1.1 Integration of Thin Film Photonic Devices Onto Micromachined Movable Platforms Scott T. Wilkinson, Young W. Kim, Nan M. Jokerst, and Mark G. Allen.

IEEE Transactions on Electron Devices, vol. 39, No. 10, Oct. 1992 Base Doping Optimization for Radiation–Hard Si, GaAs, and InP Solar Cells Godfrey Augustine, Student Member, IEEE, Aject Rohatgi, Fellow, IEEE, and Nan Marie Jokerst, Member IEEE 0018–9383/93$03.00 1992 IEEE.

IEEE Photonics Technology Letters, vol. 4, No. 9, Sep. 1992 Vertical Electrical Interconnection of Compound Semiconductor Thin–Film Devices to Underlying Silicon Circuitry C. Camperi–Ginestet, Y. W. Kim, N. M. Jokerst, M. G. Allen, and M. A. Brooke 1041–1135/92$03.00 1992 IEEE.

Absorption Measurements of Doped Thin Film InP for Solar Cell Modeling G. Augustine, N. M. Jokerst, A. Rohatgi Microelectronics Research Center School of Electrical Engineering Georgia institute of Technology Alanta, Georgia 30332–0250.

IEEE Transactions Photonics Technology Letters, vol. 3, No. 12, Dec., 1991 Alignable Eptiaxial Liftoff of GaAs Materials with Selective Deposition Using Ployimide Diaphragms C. Camperi–Ginestet, M. Harigis, N. Jokerst, and M. Allen 1041–1135/91$01.00 1991 IEEE.

Optimization of Base Doping for Radiation Hard InP Solar Cells G. Augustine, A. Rohatgi, N. M. Jokerst Microelectronics Research Center Georgia Institute of Technology Atlanta, Georgia 30332–0250.

IEEE Photonics Technology Letters, vol. 5, No. 10, Oct. 1993 Eptiaxial Lift–Off GaAs/ AlGaAs Metal–Semiconductor–Metal Photodetectors with Back Passivation 1041–1135/93$03.00 1993 IEEE.

High–Q Rectangular Cavities and Waveguide Filters using Periodic Metalo–Dielectric Slabs Harry Contopanagos, Nicolaos G. Alexopoulos & Eli Yablonovitch Department of Electrical Engineering University of California Los Angeles, Los Angeles, CA 90095 Department of Electrical and Computer Engineering University of California Irvine, Irvine, CA 92697 0–7803–4471–5/98/$10.00 1998 IEEE 1998 IEEE MTT–S Digest.

Eliminating Surface Currents With Metallodielectric Photonic Crystals San Sievenpiper, Eli Yablonovitch Electrical Engineering Department University of California, Los Angeles 405 Hilgard Aveneue, Los Angeles, CA, 90095 0–7803–4471–5/98/$10.00 1998 IEEE 1998 IEEE MTT–S Digest.

Terabit Switching and Security Enhancement in a WDM/TDM Hybrid System Cedric F. Lam Eli Yablonovitch UCLA Electrical Engineering Department 405 Hilgard Ave., Los Angeles, CA 90095–1594.

A Configurable Wavelength Demultiplexer Using Filter Chains Cedric F. Lam and Eli Yabonovitch UCLA, Electrical Engineering Department 405 Hilgard Ave., Los Angeles, CA 90025–1594.

Spontaneous Emission Engineering in Light Emitting Diodes Misha Boroditsky, UCLA, Physics Department Eli Yablonovitch, UCLA, Electrical Electrical Engineering Department 0–7803–3895–2/97/$10.00 1997 IEEE.

Three–Junction Solar Cells Comprised of a Thin–Film GainP/GaAs Tandem Cell Mechanically Stacked on a Si Cell' Y. Yazawa, K. Tamura, S. Watahiki, T–Kitatani, H. Ohtsuka, and T. Warabisako Central Research Laboratory, Hiltachi Ltd. 1–280 Higashi–Koigakubo, Kokbunji–shi, Tokyo 185, Japan 0–7803–3767–0/97/$10.00 1997 IEEE 26th PVSC; Sep. 30–Oct. 3, 1997; Anaheim, CA.

0–7803–3895–2/97$10.00 1997 IEEE Mesurement of internal quantum efficiency and surface recombination velocity in InCaN structures.

Multi–Wavelength, Optical Code–Division–Multiplexing Based on Passive, Linear, Unitary, Filters Cedric F. Lam and Eli Yablonovitch Electrical Engineering Dept., University of California, Los Angeles, Los Angeles, CA 90095–1594 E–mail: flam@ee.ucla.edu and eliy@ee.ucla.edu o–7803–2516–8/95 $4.00 1995 IEEE.

A New Era for Spontaneous Emission: The Single–Mode Light–Emitting Diode by E. Yablonivitch UCLA Electrical Engineering Department 405 Hilgard Ave. Los Angeles, CA 90024–1594 tel. (310) 206–2240 Fax: (310) 206–8495.

IEEE Photonics Technology Letters, vol. 2, No. 3. Mar. 1990 Optical Coupling of GaAs Photodetectors Integrated with Lithium Niobate Waveguides W. K. Chan. Member, IEEE A. Yi–Yan. T. J. Gmitter,. L. T. Fiorez, J. L. Jackel, D. M. Hwang, E. Yablonovitch, Member, IEEE, R. Bhat, Member, IEEE, and J.P. Harbison 1041–1135/90/0300–0194$01.00 1990 IEEE.

Effects of Perimeter Recombination on GaAs–Based Solar Cells T.B.Stellwag, P.E. Dodd, M.S. Carpentter, M.S. Lundstrom, R.F. Prerret, M.R. Melloch, F. Yablonovitch, and T. J. Gmitter School of Electrical Engineering Purdue University West Lafayette, IN USA 47907 Bell Communications Research Navesink Research Center Read Bank, NJ, USA 07701–7020 0168–8371/90/0000–0442 $1.00 1990 IEEE.

1998 International Conference on Multiple Modules and High Desity Packaging Solution to Catastrophic Yield Problems in MCM–D Interconnect Production Julia Hawaley and Van Vo Raytheon System Company 13532 North Central Expressway Dallas, Texas 75265 (972)995–5447 Office (972)995–7017 Fax J–FOLLER2@TI.COM 0–7803–4850–8/98 $10.00 1998 IEEE.

1997 international Symposium on Advanced Packaging Materials Single Mask Stress Buffer B. Rogers, D. Scheck, and P. Garrou Dow Chemical @ MCNC, Research Triangle Park, NC A. Strandjord, B. DeVellis, and E. Moyer The Dow Chemical Company, Midland, MI Y.Ida The Dow Chemical Company, Gotemba, Japan S. Shiau The Dow Chemical Company, Taipei, Taiwan.

Journal of Microelectromechanical Systems, vol. 4, No. 3, Sep. 1995 Sacrificial Wafer Bonding for Planarization After Very Deep Etching Vincent L. Spiering, J. W. Bereschot, Miko Elwenspoek, and Jan H. J. Fluitman, Member, IEEE 1057–7157/95$04.00 1995 IEEE.

Alignable Lift–Off Transfer of Device Arrays via a Single Polymeric Carrier Membrane John J. Callahan, Rainer Dohle, Kevin P. Martin, Timothy J. Drabik School of Electrical and Computer Engineering and Microelectronics Research Center Georgia Institute of Technology Atlanta, GA 30332 0569–5503/95/0000–1274 $3.00 1995 IEEE.

Wafer Bonding of Si with Dissimilar Materials Q–Y. Tong, G. Kidao, T. Y. Tan and U. Gosele Wafer Bonding Laboratory, Duke University, Durham, NC 27708–0300, USA, Tel: (919)–660–5360, Fax: (919)–660–8963.

Epitaxial Lioftoff of GaAs Detectors Onto Silicon Integrated Circuits Nan Maric Jokerst School of Electrical Engineering Microelectronics Research Center Manufacturing Research Center Georgia Institute of Technology Atlanta, GA 30332–0250.

CLEO 1998 Controlling Surface Plasmons on Metallodielectric Photonic Crystals Sievenpiper et al.

IEEE Transaction on Electron Devices vol. 40, No. 11, Nov. 1993 IIB–6 Ultra–High Efficiency Light–Emitting–Diode Arrays Scnitzer, er al.

Silicon Nitride Deposition Process for Low Cost Microelectronics Applications Thomas J. Sanders, Ed Lee Caraway and Chris Hall Florida Institute Of Technology, Melbourne, FL 32901 and J.H. Linn, Cal Adkins, Hector Deju, and Thomas Buschor Harris Corporation, Melbourne, FL 32901 0–7803–3790–5/97/$3.00 1997 IEEE.

* cited by examiner

PROCESS FOR LIFT OFF AND HANDLING OF THIN FILM MATERIALS

The invention was made with Government support under contract number DAAH01-97-C-R098, awarded by the Department of Defense, US Army Aviation and Missile Command. The Government has certain rights in the invention.

FIELD OF THE INVENTION

The present invention relates to semiconductor processing, and more particularly, to thin film semiconductor processing.

BACKGROUND OF THE INVENTION

A critical phase in semiconductor processing involves handling and packaging of thin film semiconductor devices. Such semiconductor devices are manufactured by depositing a thin film expitaxial layer on a sacrificial layer on a growth substrate. The thin film layer is known as epitaxial lift-off ("ELO") film and typically includes thin film semiconductor devices which have been removed from the substrate. Because the thin film semiconductor devices are fragile and have extremely narrow dimensions, they are very difficult to handle, bond to substrates, and package. Specifically, such semiconductor devices are fragile and can crack under very small forces, making them difficult to handle. Further, the very thin nature of such semiconductor devices makes them very difficult to align with new substrates. Because high planarity is required (z-alignment), the difficult handling of thin film semiconductor devices makes x and y alignment difficult.

To alleviate such difficulties, some conventional techniques for handling thin film semiconductor devices involve isolating a thin film layer from the growth substrate without removing the growth substrate by e.g. Silicon On Insulator, or by bonding of the thin film semiconductor devices to a new substrate for packaging before removing the growth substrate. However, such techniques provide inadequate device and package performance upon removing the substrate before packaging. In addition, the required mechanical and chemical processing methods are detrimental to the package as a whole, degrading performance of devices in an entire package.

Other conventional techniques for handling thin film semiconductor devices involve individually handling the semiconductor devices after removing the growth substrate, and use of different bonding techniques such as Van der Waals or eutectic bonding. The bonding process is to provide ease of handling the thin film layers, improved thermal performance, electrical interconnection, etc. However, such techniques are unsuitable for handling the thin, fragile semiconductor devices in an efficient manner without damaging them- Further, such techniques prevent proper alignment and/or bonding of the semiconductor devices; provide inadequate bonding strength of the semiconductor devices to a new substrate or package; are not thermally compatible with desired bond processes; provide inadequate yield; provide low throughput serial handling of the semiconductor devices; prevent selection and control of individual semiconductor devices during bonding; and prevent proper control of the process such as aligning the semiconductor devices properly, achieving bonding planarity, controlling bonding force, and achieving repeatable and consistent results.

There is, therefore, a need for a repeatable process to fabricate, remove the growth substrate of, handle, and selectively bond thin film semiconductor devices to a new substrate in parallel.

BRIEF SUMMARY OF THE INVENTION

The present invention satisfies these needs. In one embodiment, the present invention provides a method for lift-off of at least one thin film layer situated on a substrate, comprising the steps of: (a) depositing a support layer such as polymer on the thin film layer, wherein the support layer maintains the structural integrity of the thin film layer; (b) attaching a rigid carrier superstrate to the support layer; and (c) removing at least a portion of the substrate, wherein the thin film layer remains attached to the carrier superstrate via the support layer. Attaching the carrier superstrate to the support layer can include using an adhesive layer between the carrier superstrate and the support layer to attach the carrier superstrate to the support layer.

After removing the substrate, the thin film layer is attached to a host substrate, and the carrier superstrate is removed from the thin film layer to leave the thin film layer attached to the host substrate. Removing the carrier superstrate from the thin film layer can include mechanically detaching the carrier superstrate from the thin film layer, such that only selected segments of the thin film layer remain attached to the host substrate.

Attaching the thin film layer to the host substrate can include selectively attaching segments of the thin film layer to the host substrate, such that when the carrier superstrate is removed, the selected segments of the thin film layer remain attached to the host substrate. The selective attachment can be by selectively depositing bonding material on segments of the host substrate, and aligning the thin film layer with the host substrate such that the selected segments of the thin film material are aligned with said segments of the host substrate, respectively.

BRIEF DESCRIPTION OF THE DRAWINGS

These and other features, aspects and advantages of the present invention will become understood with reference to the following description, appended claims and accompanying figures where:

DETAILED DESCRIPTION OF THE INVENTION

Figure 1:
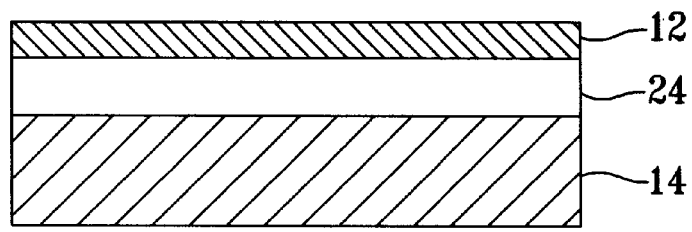
FIGS. 1–10 collectively illustrate an embodiment of a lift-off and handling process in accordance with on aspect of the present invention.

In one embodiment the present invention provides a method for handling thin film semiconductor layer including lift-off of a thin film layer 12 situated on a substrate 14 by steps including: depositing a support layer 16 on the thin film layer 12, wherein the support layer 16 maintains the structural integrity of the thin film layer 12; attaching a carrier superstrate layer 18 to the support layer 16; and removing the substrate layer 14, wherein the thin film layer 12 remains attached to the carrier superstrate layer 18 via the support layer 16.

Referring to the laminar structure 10 in FIG. 1, in an example implementation, a semiconductor substrate 14 containing fully functional devices 20 such as e.g. individual light emitting diodes, transistors, etc. or circuits such as complete circuits including for example power amplifier circuits, etc. are utilized. The substrate 14 can be e.g. Gallium Arsenide, Silicon, Germanium, etc. or a combination of two or more thereof, and can include any other substrate used to grow semiconductor or electronic devices, such as Sapphire or superconducting substrates such as yttrium copper oxide (YBCO). The substrate 14 can be e.g. from about 2" to about 12" in diameter wafer.

Figure 2:
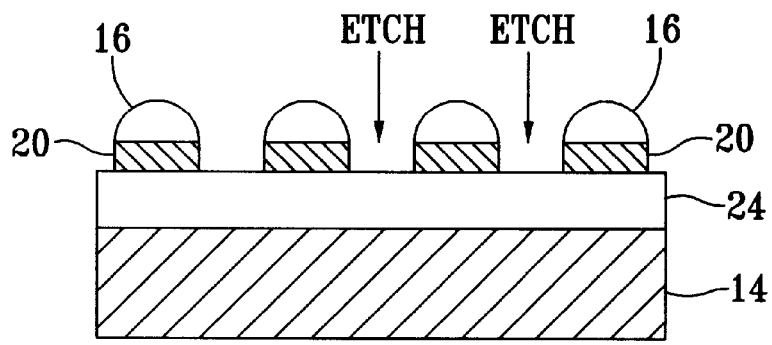

The devices 20 are formed by depositing an epitaxial layer 12 on a sacrificial layer 24 situated on the growth substrate 14. As shown in FIG. 2, according to the present invention, the support layer 16 is applied to the surface of the substrate 14 over the semiconductor devices 20. The support layer 16 can be e.g. a polymer, curable material such as spin or glass, or any material which can be deposited such as polycrystalline materials or metals. Deposition methods include spinning on the material, dispensing, evaporation, sputtering, etc. The thickness range for the support layer 16 can be from about two or three microns to about two or three hundred microns. Preferably, a the support layer 16 is about twenty five microns thick.

The support layer 16 can be patterned in a variety of ways commonly used in the semiconductor industry such as e.g. shadowing during deposition, selective dispensing in a particular area, etching or photo-developing of the support layer 16 after deposition. Further the support layer 16 can be a combination of two or more of the materials discussed above. The support layer 16 can also be a combination one or more of the materials discussed above and one or more other materials.

In addition to providing structural integrity to the semiconductor devices 20, the support layer 16 (e.g. polymer) allows patterning of the devices 20 for etching of channels 25 or "streets" between the devices 20, thereby eliminating the need for dicing the substrate 14 to create individual devices 20. Channel etching can utilize a separate polymer or the same polymer used as the support layer 16. Channel etching utilizes a mask to define the channel area. The deposited support layer 16, such as polymer, can be used as the mask for etching the channels 25 between the devices 20. A common photoresist or other masking material can also be used on top of the deposited polymer 16 as the mask for the channel etch.

Figure 3:
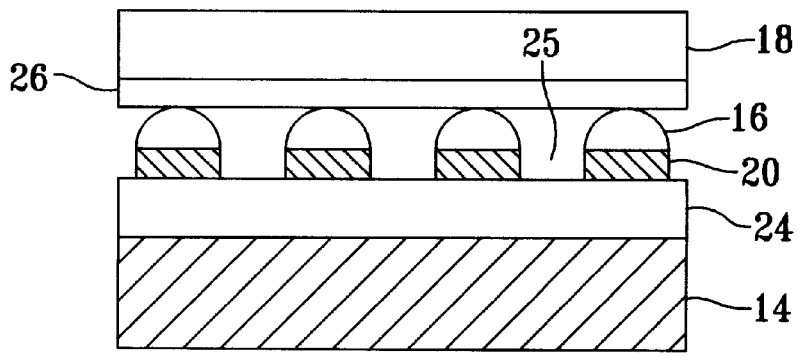

The polymer 16 is deposited in e.g. domes, and provides an attachment mechanism or "handle" to a rigid intermediate carrier superstrate 18 shown in FIG. 3. Examples of the rigid intermediate carrier superstrates 18 include sapphire, quartz, alumina and other ceramics, a semiconductor wafer or nearly any rigid, flat, planar material having chemical, mechanical and thermal expansion properties compatible with the substrate etch and bonding steps. The superstrate 18 can be e.g. from about 50 microns to several millimeters in diameter. A thinner superstrate 18 can flex and provide more conformal bonding to the host substrate 28, while a thicker superstrate 18 can provide more rigid strength and control during the bonding process. Rigidity of the carrier superstrate 18 and bonding of the devices 20 to the superstrate 18 for handling prevents the devices 20 from shifting or sliding around, thereby preserving spacial ordering of the devices 20 (e.g. array) and making subsequent alignment with a new substrate simple.

A thin layer of adhesive 26 can be deposited on the intermediate carrier superstrate 18, and the intermediate carrier superstrate 18 is attached to the devices 20 via the polymer layer 16. Examples of the adhesive layer 26 include epoxy, pressure sensitive adhesive, polymer similar to the support layer 16 or other material which when cured or partially cured acts as an adhesive to the support layer 16. The adhesive layer 26 can be spun onto the carrier superstrate 18, and can also be sprayed, atomized, sputtered, or applied in any method that provides a uniform layer of adhesive. The thickness of the adhesive layer 26 is selected based on the thickness of the polymer layer 16, wherein the thickness of the adhesive layer 26 is a fraction (e.g. between $\frac{1}{10}$ and $\frac{1}{2}$) of the thickness of the polymer layer 16. As such, the thickness of the adhesive layer 26 can be e.g. from about 1 micron to about 150 microns depending on the thickness of the polymer layer 16. Preferably, the adhesive layer 26 is about 4 microns thick. Though not necessary, the adhesive layer 26 on the intermediate carrier superstrate 18 can be cured. Curing the adhesive layer 26 can include thermal curing, room temperature drying, ultraviolet exposure, etc. or any combination thereof.

The polymer domes 16 act as handles to attach each individual device 20 to the intermediate carrier superstrate 18. Each device 20 can be from about 0.1 $\mu$m to about 50 $\mu$m thick, and preferably from about 1 $\mu$m to about 5 $\mu$m thick. Lateral dimension for each device 20 can be from about 10 $\mu$m to about 1300 $\mu$m on a side (1.3 mm). The devices 20 are subsequently separated from their substrate 14 as described further below. The support polymer 16 protects the devices 20 from the subsequent removal of the substrate 14 via e.g. an ElO etching process or a substrate etching process. The polymer layer 16 is uniformly deposited on the substrate 14 over the devices 20. The uniformity of the polymer layer 16 and the thin profile of the adhesive layer 26 on the intermediate carrier superstrate 18, ensure that the plane of the devices 20 is parallel with the plane of the intermediate carrier superstrate 18. This allows proper subsequent handling and bonding of the devices 20 to a new substrate 28 for packaging.

Example epoxy curing temperatures can be from about 100° C. to about 250° C., and solder reflow temperatures can be from about 120° C. to about 280° C. Further, example adhesive layer curing temperatures can be from about 60° C. to about 200° C., and preferably about 90° C.

Figure 4:
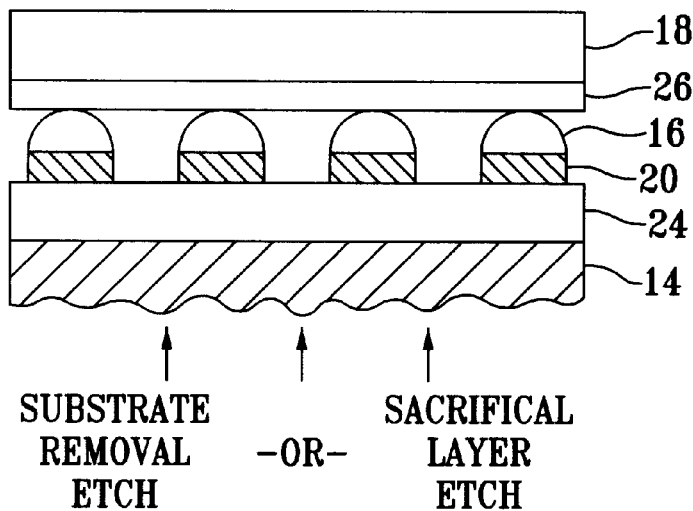

Referring to FIG. 4, the intermediate carrier superstrate 18 can be handled in the same manner as for conventional chips or wafers. As such, the semiconductor substrate 14 can be processed from the backside easily. The semiconductor substrate 14 is removed chemically by e.g. etching from the backside or lateral etching of a sacrificial layer 24 between the devices 20 and the substrate 14 to separate the devices 20 from the substrate 14. Substrate removal can include the steps of a wet or dry etching which stops at an etch stop layer (usually immediately below the devices 20) controlling precisely (to several nanometers) the amount of substrate 14 removed and thus the amount of material remaining. Backside processing can be performed by steps including material deposition (spinning, evaporation, sputtering, or other deposition techniques typical to the semiconductor industry), photolithography, etching, ion implanting, metal deposition and patterning, metal alloying, oxidation growth, etc.

Figure 5:
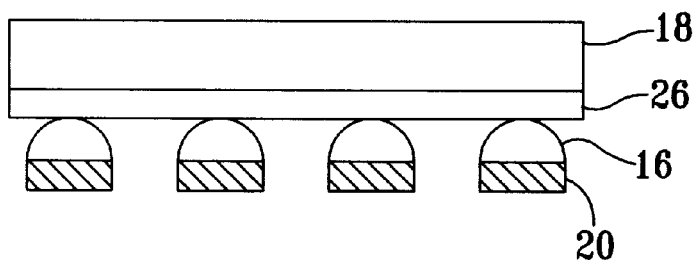

Referring to FIG. 5, after the substrate 14 (and sacrificial layer 24) is removed, the thin film devices 20 remain attached to the intermediate carrier superstrate 18 via the support polymer 16. Because the intermediate carrier superstrate 18 is selected to be robust, the devices 20 attached to the superstrate carrier 18 can be handled in a similar fashion as a chip or wafer via e.g. backside processing of the thin film devices 20, as though the devices 20 were on the original substrate 14. The thin film devices 20 can then be subjected to backside processing via e.g. etching or material deposition. The backside processing of the devices 20 can be performed to improve the device characteristics—passivation of the backside, backside etching for device definition, metal electrical contacting to the devices 20, deposition and patterning of conducting or insulating layers on the backside of the devices 20. Such backside processing can also aid in the bonding of the devices 20 to the new host substrate 28. Metal (or other material) pads can be deposited for solder (other bonding material) adhesion or alignment marks can be made on the backside for ease of alignment with the new host substrate 28. The steps of backside processing can include materials spinning and curing, materials evaporation, photolithography, etching, sputtering, materials growth or oxidation, alloying, etc.

Figure 6:
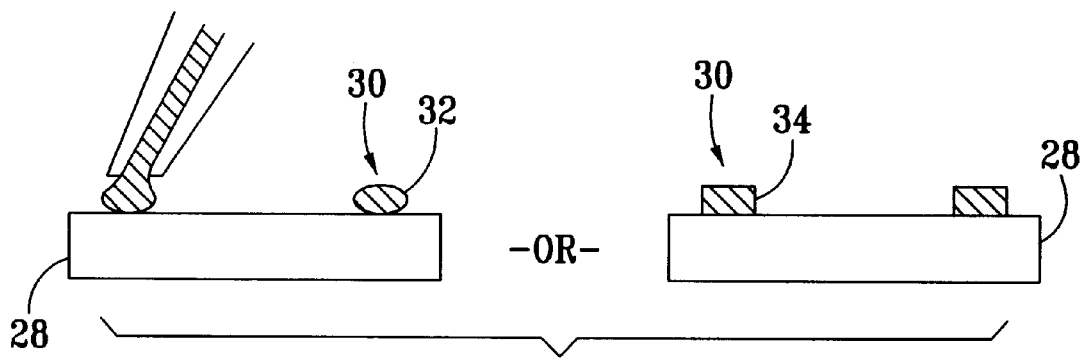

As shown in FIG. 6, the new substrate 28 (host substrate) is selected for attachment or bonding to the thin film devices 20. The new substrate 28 can comprise glass, silicon, Aluminum Nitride (AlN), gold, flexible copper foil, etc. Further, the new substrate can include any material which an epoxy or solder can stick to. Other desirable new substrate examples can include semiconductor chips, ceramics, rigid or flexible plastic plates, glass or plastic fibers (as in waveguide fibers used in fiber optics) metal casings or packages for adhering electronics, superconductor materials, etc. thereto. The new substrate 28 is prepared for bonding by bonding material 30 such as e.g. epoxy 32, solder 34, etc. for bonding to the thin film devices 20.

Figure 7:
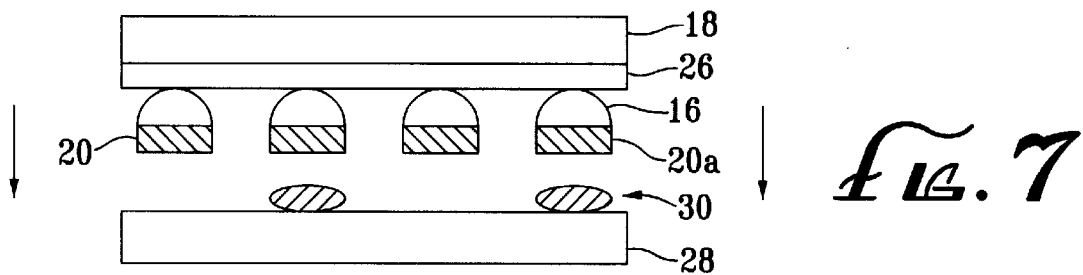

The bonding material 30 is selectively deposited by e.g. dispensing, evaporation, electroplating or other means, onto the surface of the new substrate 28 as shown in FIGS. 6–7. The selective deposition of the bonding material 30 allows selection of particular thin film devices 20 to be removed or "plucked" from the temporary intermediate carrier superstrate 18. Alternatively, the bonding material 30 can be deposited over the entire surface of the new substrate 28 and selectively cured. In either case, the bonding material 30 is deposited in small volumes to be compatible with very thin film devices 20 and with required high degree of planarity. Example volumes for the bonding material can include PicoLiter or nano Liter volumes such that thickness of the bonding material 30 is on the scale of the thickness of the epitaxial lift off devices 20 (e.g. About 0.1 to about 1 microns). Preferably the bonding material 30 includes the epoxy 32, dispensed in very small volumes from narrow capillary tubes using surface tension forces to determine the volume dispensed and control the dispensing process.

The intermediate carrier superstrate 18 with the thin film devices 20 is then aligned with the selectively deposited bonding material 30 on the new substrate 28. Because the thin film devices 20 are fabricated on, and remain in the same configuration as on the original growth substrate 14, there is a high degree of planarity among the individual thin film devices 20 in an array. This planarity aids in the handling, alignment, and bonding of the devices 20 while they are in an array configuration attached to the intermediate carrier superstrate 18.

Figure 8:
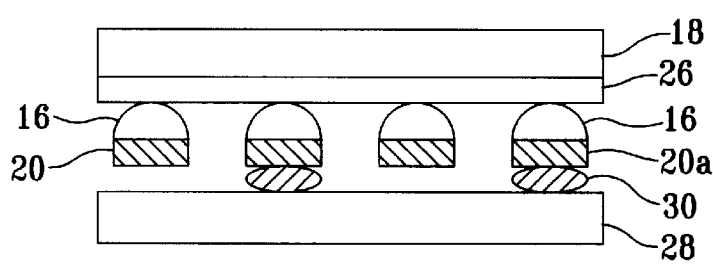
Figure 9:
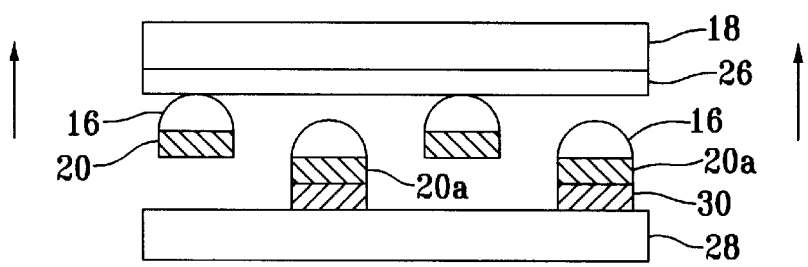

Referring to FIG. 8, once the thin film devices 20 are aligned with the bonding material 30 on the new substrate 28, and brought into contact, the bonding material 30 can be batch cured (or, in the case of solder, reflowed) thereby bonding a selected number of the devices 20 to the new substrate 28 in parallel. Subsequently, as shown in FIG. 9, in a removal process, the intermediate carrier superstrate 18 is pulled away from the new substrate 28, breaking the weak adhesive bond between the selected thin film devices 20a and the intermediate carrier superstrate 18, and thereby plucking the selected thin film devices 20a from the intermediate carrier substrate, such that the selected thin film devices 20a remain attached to the new substrate 28. Any non-selected thin film devices 20, however, remain attached to the intermediate carrier superstrate 18 for subsequent bonding to another new substrate.

Before breaking said adhesive bond between the intermediate carrier superstrate 18 and the polymer 16, the bond (i.e., the combination of the polymer and the adhesive) can be exposed to e.g. a chemical solution or UV light, to weaken the bond prior to breaking of the bond. However, this weakening step is not required. The remaining polymer 16 on the thin film devices 20a attached to the new substrate 28 can be removed by e.g. a dry or wet etch such as a simple solvent. The new substrate 28 can also be conventionally diced, leaving chips with thin film devices on a highly desired new substrate, rather than on the original growth semiconductor substrate 14. In either case, conventional electrical interconnection techniques such as wire bonding, flip chip, etc. can then be used to electrically interconnect the thin film devices 20a to the new substrate 28, to other devices, or the board or fixture upon which the thin film devices 20a can subsequently mounted.

Figure 10:
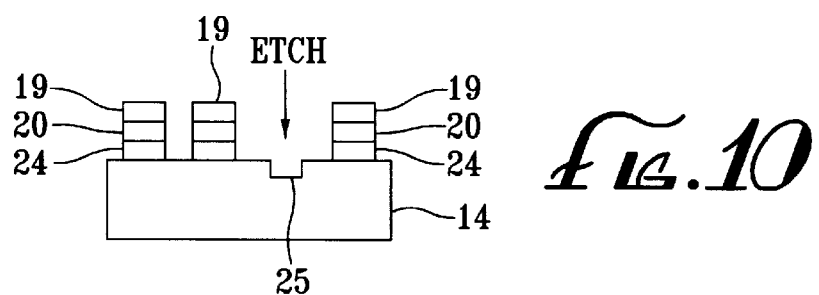

Referring to FIG. 10, the support layer 16 (e.g., polymer) on top of the thin film devices 20 provides mechanical support to the thin film devices 20, as well as mechanical interface between the thin film devices 20 and the intermediate carrier superstrate 18. The polymer 16 also allows etching large gaps or channels 25 between the thin film devices 20 and the intermediate carrier superstrate 18. Before application of the carrier superstrate 18, a polymer mask 19 can be applied to the thin film layer 12 or devices 20 allowing etching of channels 25 between the devices 20. The mask 19 can be applied, and subsequently removed as necessary, before application of the polymer adhesive/support layer 16. The etch mask 19 allows etching the layer 12, and even the sacrificial/etch stop layer 24 and the substrate material 14 between the devices 20 to make the channels 25 larger.

This is advantageous when e.g. sacrificial etching is performed, wherein said channels allow acid to access the etch layer. The channels also provide physical separation between the thin film devices 20 and the intermediate carrier superstrate 18 to maintain structural integrity of the thin film devices 20. Due to inherent stresses within the devices 20 or between the devices 20 and any polymer (including the attachment polymer 16) or the substrate 18, the larger the area of the thin film devices 20, the more likely are the thin film devices 20 to crack. These stresses can be the result of contraction during curing, deposition or heating and cooling (coefficient of thermal expansion mismatches). The magnitude of the stresses is directly correlated with the linear dimension of the ELO film, therefore the smaller the film, the smaller the stress. By etching channels between the devices 20 and separating the devices 20, the linear dimension is kept to a minimum. Further, because the devices 20 can be individually pulled from the intermediate carrier superstrate 18, a physical separation of the devices 20 can be required.

Figure 11:
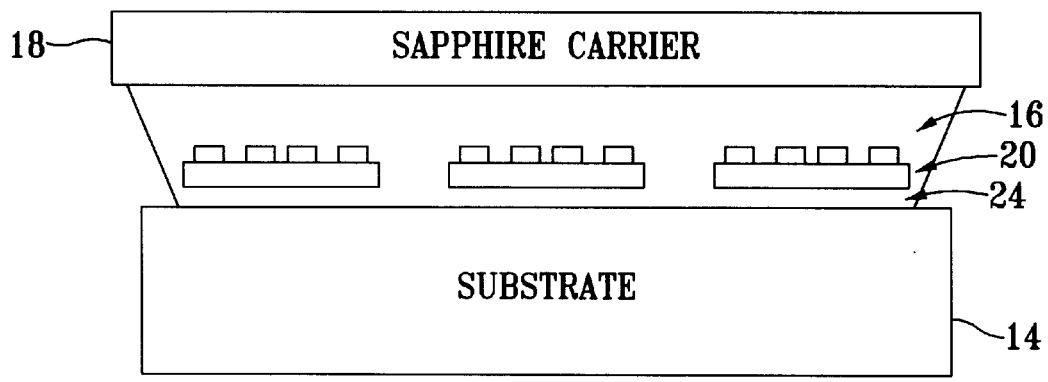
FIGS. 11–15 collectively illustrate another embodiment of a lift-off and handling process in accordance with another aspect of the present invention.
Figure 12:
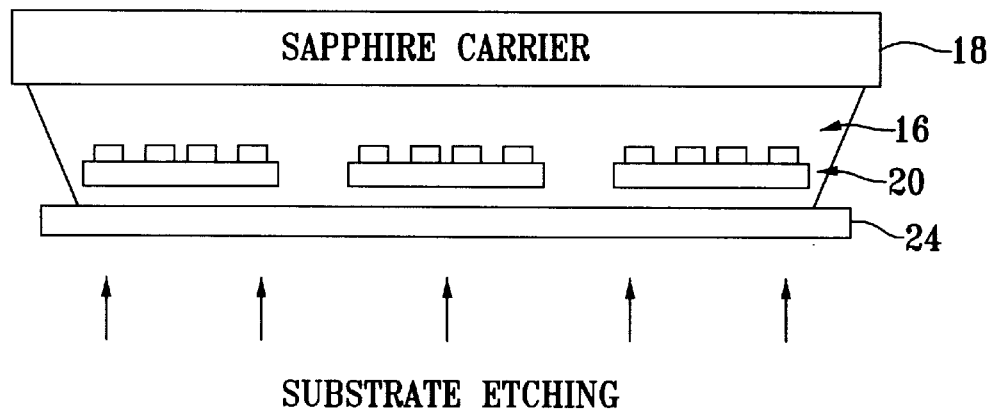

FIGS. 11–15 collectively illustrate another embodiment of a lift-off and handling process in accordance with another aspect of the present invention. FIG. 11 shows a growth semiconductor substrate 14 including an etch stop layer 24 and multiple devices 20 thereon, wherein polymer 16 is deposited on the devices 20 and attached to an intermediate carrier superstrate 18 (e.g., a sapphire carrier superstrate). Referring to FIG. 12, the growth substrate 14 is processed from the backside, whereby the substrate 14 is removed chemically by e.g. etching from the backside or lateral etching of the sacrificial layer 24 between the devices 20 and the substrate 14 to separate the devices 20 from the substrate 14.

Figure 13:
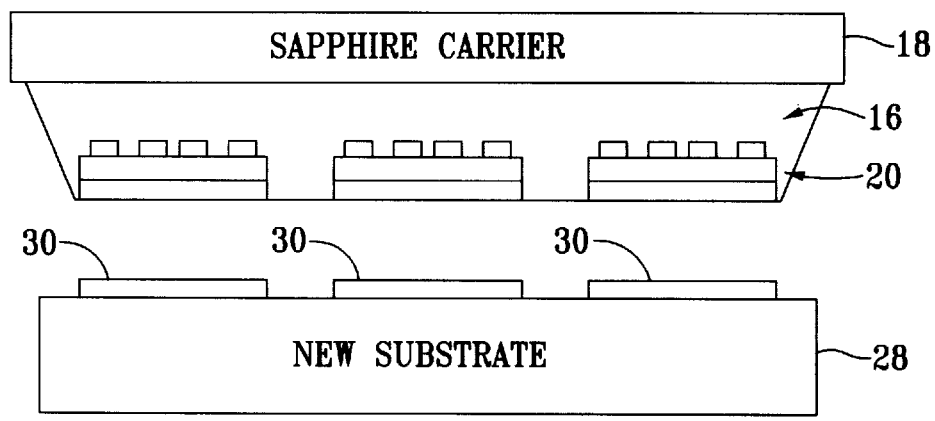

Referring to FIG. 13, after the substrate 14 is removed, the thin film devices 20 remain attached to the intermediate carrier superstrate 18 via the polymer 16. The thin film devices 20 are then subjected to backside processing by e.g. etching or material deposition. A new substrate 28 is selected for attachment to the thin film devices 20, and prepared for bonding via e.g. an epoxy, solder, or other bonding material 30 for bonding to the thin film devices 20. The bonding material 30 is deposited by e.g. dispensing, evaporation, electroplating or other means, onto the surface of the new substrate 28. The non-selective deposition of the bonding material 30 provides removal of all the devices 20 from the intermediate carrier superstrate 18. The bonding material 30 is deposited in small volumes to be compatible with very thin film devices 20 and with required high degree of planarity.

Figure 14:
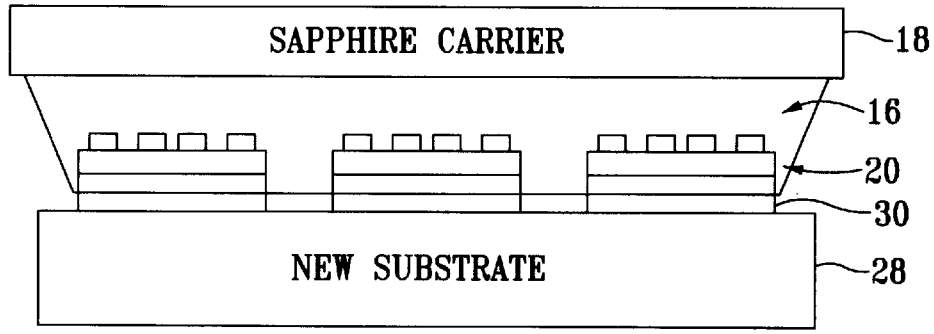
Figure 15:
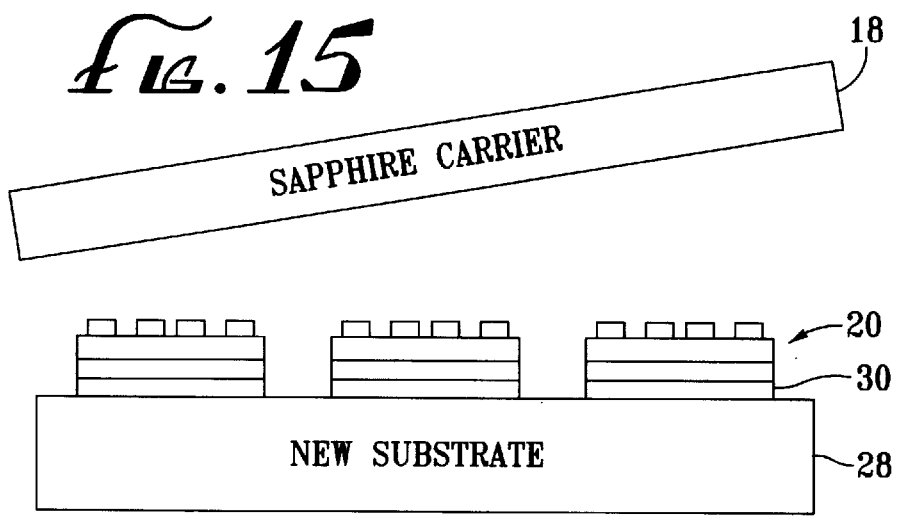

The intermediate carrier superstrate 18 with the thin film devices 20 is then aligned with the deposited bonding material 30 on the new substrate 28. Once the thin film devices 20 and new substrate 28 are aligned and in contact, the bonding material 30 is batch cured (or, in the case of solder, reflowed) thereby bonding the devices 20 to the new substrate 28 in parallel as shown in FIG. 14. Subsequently, as shown in FIG. 15, in a removal process the intermediate carrier superstrate 18 is mechanically pulled away from the new substrate 28, breaking the bond between the thin film devices 20 and the intermediate carrier superstrate 18, and thereby plucking all of the thin film devices 20 from the intermediate carrier substrate 18, such that the thin film devices 20 remain attached to the new substrate 28. As such, removal of the devices 20 from the carrier superstrate 18 does not require chemical, thermal, or other processing. Chemical weakening of the polymer 16 can help removal however.

The polymer 16 on the thin film devices 20 can be removed by e.g. a dry or wet etch such as a simple solvent. The new substrate 28 can also be conventionally diced, leaving chips with thin film devices 20 on the new substrate 28, rather than on the growth substrate 14. In either case, conventional electrical interconnection techniques such as wire bonding, flip chip, etc. can then be used to electrically interconnect the thin film devices 29 to the new substrate 20, to other devices, or the board or fixture upon which the thin film devices 20 can subsequently be mounted.

Large arrays of the thin film semiconductor devices 20 can be handled according to the process of the present invention to bond to new substrates 28 simultaneously. For example, the process of the present invention can be utilized for e.g. 2"×2" arrays of several devices.

Using a support layer 16, such as the polymer, as interface between the thin film devices 20 and the intermediate carrier superstrate 18 is advantageous because the polymer 16 provides a compressive stress which adds to the thin film strength, and as a result the thin film devices 20 are stronger under compression. The polymer 16 provides this compressive stress while the rigid carrier superstrate 18 provides a mechanism for handling the thin film devices 20 without touching or handling the thin film devices 20 themselves. An adhesive layer 26 can absorb mechanical impact between the rigid superstrate 18 and the polymer 16, and the adhesive (thermal) curing reflows the adhesive layer 26 and the polymer 16 reinstating its structural strength. Further, the polymer 16 provides a temporary bond between the thin film devices 20 and the carrier superstrate 18.

According to the present invention, one or more of the thin film devices 20 can be removed from the intermediate carrier superstrate 18 from an array of said thin film devices 20. The removal process can be repeated multiple times. As such, the removal process can be both a serial and a batch process. The very thin and fragile devices 20 are handled in an array. The thin film devices 20 can be bonded to a new substrate 28 all at once for removal (FIGS. 10-14), or in selected subsets (FIGS. 1–9), each subset bonded to a different new substrate 28 in turn. Thin film devices 20 and entire ELO circuits can be bonded to a variety of new substrates 28, selectively and in a batch process (where one, several, or all of the devices are bonded in a single step). The intermediate carrier superstrate 18 holding the array of thin film devices 20 can be repeatedly used to handle and bond some or all of the remaining thin film devices 20 after an initial cycle of removing selected thin film devices 20 from the carrier superstrate 18. The intermediate carrier superstrate 18 can be reused until all of the thin film devices 20 have been removed and bonded to their desired new substrates. Then, the intermediate carrier superstrate 18 can be cleaned and used in future manufacturing runs.

The entire growth substrate 14 can be chemically removed, leaving only the desired thin film devices 20 for bonding to a new substrate 28, before the devices 20 are mounted to the new substrate 28 as the final substrate. The ability to remove the thin film devices 28 from the carrier superstrate 18 using bonding to the new substrate 28, combines two transfer steps into one. First, the thin film devices 20 are "transferred" from the growth substrate 14 to the intermediate carrier superstrate 18 when the substrate 14 is removed, and then the devices are "transferred" to the new substrate 28 upon bonding to the new substrate 28 and breaking the temporary bonds between the thin film devices 20 and the carrier superstrate 18 by pulling the thin film devices 20 off of the intermediate carrier superstrate 18. The thin film devices 20 can be bonded to the intermediate carrier superstrate 18 with a semi-cured or weak adhesive. This allows removing selected thin film devices 20a from the carrier superstrate 18 by breaking the weak bonds, without removing non-selected thin film devices 20 from the carrier superstrate 18 through incidental contact.

Thin film devices 20 manufactured according to the process of the present invention exhibit improved performance over devices which remain on their growth substrate 14. For example, Light Emitting Diodes are brighter when their growth substrate 14 is removed and are bonded to a transparent new substrate 28 according to the present invention. Further, semiconductor circuits manufactured according to the present invention operate at lower temperatures, and are therefore much more electrically efficient, specifically when bonded to a highly thermally conducting new substrate such as Aluminum Nitride (AlN). The thin film devices operate more efficiently because of the reduced thermal path and lower operating temperatures created as a result of this technique. Entire arrays of thin film semiconductor devices can be handled in a batch process, and selected devices therefrom can bonded to a variety of new substrates.

Further, process parameters such as temperature, support layer 16 (e.g. polymer) dimensions and volumes and bonding forces applied can be selected to induce controlled warpage to the thin film devices 20 upon depositing polymer 16 on the thin film devices 20 and/or bonding of extremely thin film devices 20 to the new substrate 28. Some applications may advantageously utilize such a warped, curved, or stressed characteristic of a semiconductor or other material thin film.

The present invention provides a purely mechanical process to select and bond the thin film devices 20, 20a to the new substrate 28, and to remove the devices 20 from the intermediate carrier superstrate 18 such that the devices are transferred to the new substrate 28. No modifications to the bonding equipment are necessary for selective bonding of the devices 20 to the new substrate 28. The devices 20 can be handled easily and safely after the growth substrate 14 has been removed, allowing backside processing of the devices. The intermediate carrier superstrate 18 provides the advantages of a wafer, allowing the devices 20 to be easily processed in conventional semiconductor equipment. Further, backside materials deposition and etching can be performed without disturbing the ordered array of the devices 20. Because the carrier superstrate 18 is suitable for handling by equipment used in semiconductor manufacturing, alignment, manipulation and subsequent bonding of the devices 20 to a new substrate 28 is simple. Further, the carrier superstrate 18 is thermally stable, and compatible with desired pre-bonding processes such as backside processing, and with bonding processes.

Therefore, the method of the present invention provides several advantages over conventional thin film processing methods, including: (1) ability to control the locations of the thin film devices 20 on the carrier superstrate 18 and preventing loss of order in an array of the thin film devices 20, making the subsequent alignment to the new substrate 28 simple, (2) individual thin film devices 20 can be selected for bonding in serial or many at one time, (3) the handling mechanism comprising the carrier superstrate 18 is thermally compatible with desired bonding processes, and is able to handle the elevated temperatures desired or required, (4) a new mechanism to release the thin film devices 20 from the intermediate carrier superstrate 18 is not required, (5) modifications to the bonding equipment is not necessary to provide methods of weakening the thin film devices 20 from the intermediate carrier superstrate 18, (6) higher yield, (7) ability to select and control individual thin film devices 20 during bonding by selectively bonding desired devices 20a without selecting others, (8) ability to control the process such as aligning thin film devices 20 properly, achieving bonding planarity, controlling bonding force, and achieving repeatable and consistent results, and (9) simplicity in handling a large array of thin film devices 20 and achieving bond conditions to new substrates 28 for all devices simultaneously (proper process control, such as temperature, pressure, and planarity over the large area for every device).

Example applications which can benefit from the present invention include, but are not limited to: (1) heat sinking of devices or films 20, (2) increased optical efficiency of opto-electronic devices 20, (3) increased electrical performance of semiconductor devices 20 when they are removed from the original semiconductor substrate 14, (4) applications which benefit from mechanically flexible nature of the thin films 20, Etc.

The present invention has been described in considerable detail with reference to certain preferred versions thereof; however, other versions are possible. Therefore, the spirit and scope of the appended claims should not be limited to the description of the preferred versions contained herein.

What is claimed is:

1. A method for lift-off of at least one thin film layer situated on a substrate, comprising the steps of:
    (a) depositing a support layer on the thin film layer, wherein the support layer maintains the structural integrity of the thin film layer;
    (b) attaching a carrier superstrate to the support layer; and
    (c) removing at least a portion of the substrate, wherein the thin film layer remains attached to the carrier superstrate via the support layer.

2. The method of claim 1 wherein step (b) includes the steps of bonding the carrier superstrate to the support layer.

3. The method of claim 1, wherein step (b) includes the steps of using an adhesive layer between the carrier superstrate and the support layer to attach the carrier superstrate to the support layer.

4. The method of claim 1 further comprising the steps of processing the thin film layer after step (c).

5. The method of claim 4 further comprising the steps of processing the thin film layer after step (c) to form thin film devices.

6. The method of claim 1, wherein the carrier superstrate comprises a rigid superstrate.

7. The method of claim 1, wherein the support layer comprises a polymer layer.

8. The method of claim 1, wherein the thin film layer comprises thin film epitaxial materials.

9. The method of claim 1, wherein step (c) includes chemical processing of the substrate for removing said at least a portion of the substrate.

10. The method of claim 1 further comprising the steps of patterning the support layer to expose segments of the thin film layer before step (b), wherein after removing the substrate in step (c), unexposed segments of the thin film layer remain attached to the carrier superstrate via the support layer.

11. The method of claim 10 further comprising the steps of processing the exposed segments of the thin film layer to remove at least portions of said exposed segments of the thin film layer.

12. A method for lift-off of at least one thin film layer situated on a substrate, comprising the steps of:
    (a) depositing a support layer on the thin film layer, wherein the support layer maintains the structural integrity of the thin film layer;
    (b) attaching a carrier superstrate to the support layer;
    (c) removing at least a portion of the substrate, wherein the thin film layer remains attached to the carrier superstrate via the support layer;
    (d) attaching the thin film layer to a host substrate; and
    (e) removing the carrier superstrate from the thin film layer to leave the thin film layer attached to the host substrate.

13. The method of claim 12, wherein the step of removing the carrier superstrate from the thin film layer further includes the steps of mechanically detaching the carrier superstrate from the thin film layer.

14. The method of claim 13, wherein the step of detaching the carrier superstrate from the thin film layer further includes the steps of pulling the carrier superstrate off the thin film layer by mechanical exertion.

15. The method of claim 12, wherein the step of attaching the thin film layer to the host substrate further includes the steps of bonding the thin film layer to the host substrate.

16. The method of claim 12 further comprising the steps of removing the support layer from the thin film layer after removing the carrier superstrate from the thin film layer.

17. The method of claim 12, wherein the steps of removing the carrier superstrate further includes the steps of removing the carrier superstrate from the thin film layer to leave only selected segments of the thin film layer attached to the host substrate.

18. The method of claim 12, wherein:

the steps of attaching the thin film layer to the host substrate further includes the steps of selectively attaching segments of the thin film layer to the host substrate; and the steps of removing the carrier superstrate further includes the steps of removing the carrier superstrate from the thin film layer to leave said segments of the thin film layer attached to the host substrate.

19. The method of claim 18, wherein the steps of selectively attaching said segments of the thin film layer to the host substrate further includes the steps of:

selectively depositing bonding material on segments of the host substrate; and aligning the thin film layer with the host substrate such that said segments of the thin film material are aligned with said segments of the host substrate, respectively.

20. A method for lift-off of thin film layers, comprising the steps of:

(a) depositing an epitaxial thin film layers over a sacrificial layer on a substrate;

(b) depositing a support layer on the thin film layers, wherein the support layer maintains the structural integrity of the thin film layers;

(c) attaching a carrier superstrate to the support layer; and (d) removing at least a portion of the sacrificial layer to separate the thin film layers from the substrate, such that the thin film layers remains attached to the carrier superstrate via the support layer.

21. The method of claim 20 wherein step (c) includes the steps of bonding the carrier superstrate to the support layer.

22. The method of claim 20, wherein step (c) includes the steps of using an adhesive layer between the carrier superstrate and the support layer to attach the carrier superstrate to the support layer.

23. The method of claim 20 further comprising the steps of processing the thin film layers after step (d).

24. The method of claim 23 further comprising the steps of processing the thin film layers after step (d) to form thin film devices.

25. The method of claim 20 wherein the carrier superstrate comprises a rigid superstrate.

26. The method of claim 20 further comprising the steps of patterning the support layer to expose segments of one or more thin film layer before step (c), wherein after separating the substrate in step (d), unexposed segments of the thin film remain attached to the carrier superstrate via the support layer.

27. The method of claim 26 further comprising the steps of processing the exposed segments of the thin film layer to remove at least portions of said exposed segments of the thin film layer.

* * * * *